(12) United States Patent
Sato et al.

(10) Patent No.: US 8,383,964 B2
(45) Date of Patent: Feb. 26, 2013

(54) TERMINAL STRUCTURE, PRINTED WIRING BOARD, MODULE SUBSTRATE, AND ELECTRONIC DEVICE

(75) Inventors: Atsushi Sato, Tokyo (JP); Hisayuki Abe, Tokyo (JP); Takashi Ota, Tokyo (JP); Miyuki Yanagida, Tokyo (JP); Masumi Kameda, Tokyo (JP)

(73) Assignee: TDK Corporation, Tokyo (JP)

( * ) Notice: Subject to any disclaimer, the term of this patent is extended or adjusted under 35 U.S.C. 154(b) by 329 days.

(21) Appl. No.: 12/868,410

(22) Filed: Aug. 25, 2010

(65) Prior Publication Data

US 2011/0056744 A1 Mar. 10, 2011

(30) Foreign Application Priority Data

Sep. 8, 2009 (JP) ................ P2009-207423
Jun. 8, 2010 (JP) ................ P2010-130997

(51) Int. Cl.
*H01L 23/49* (2006.01)
(52) U.S. Cl. .............. 174/558; 257/738; 257/750
(58) Field of Classification Search ............ 174/520, 174/261, 558; 257/738, 750
See application file for complete search history.

(56) References Cited

U.S. PATENT DOCUMENTS

| | | | |
|---|---|---|---|
| 7,700,476 B2 * | 4/2010 | Suh et al. | ............. 438/615 |
| 2006/0202352 A1 | 9/2006 | Li et al. | |
| 2008/0293243 A1 | 11/2008 | Kang et al. | |

FOREIGN PATENT DOCUMENTS

| | | |
|---|---|---|
| EP | 1 956 114 A1 | 8/2008 |
| JP | A-2008-177261 | 7/2008 |

OTHER PUBLICATIONS

European Search Report for corresponding European Patent Application No. 10175344.0, mailed on Jan. 4, 2011.

* cited by examiner

*Primary Examiner* — Hung Ngo
(74) *Attorney, Agent, or Firm* — Oliff & Berridge, PLC (57) ABSTRACT

The present invention provides a terminal structure 14 including a terminal 12 having a conductor 40 containing at least one metal selected from the group consisting of gold, silver, and copper, a first layer containing phosphorus and nickel disposed on the conductor 40, and a second layer having a nickel/phosphorus atomic ratio smaller than that of the first layer and containing $Ni_3P$ disposed on the first layer; and solder 70 disposed on the second layer of the terminal 12, while the second layer has a thickness of at least 0.35 μm; and a module substrate 100 having the terminal structure.

8 Claims, 11 Drawing Sheets

TERMINAL STRUCTURE, PRINTED WIRING BOARD, MODULE SUBSTRATE, AND ELECTRONIC DEVICE

BACKGROUND OF THE INVENTION

1. Field of the Invention

The present invention relates to a terminal structure, a printed wiring board, a module substrate, and an electronic device.

2. Related Background Art

Package substrates made by connecting module substrates mounted with various electronic components to a motherboard and the like have been in use for electronic devices. Typically, such a module substrate is connected to the motherboard by solder-joining terminals on its surface to conductor sections of the motherboard, whereby the electronic components mounted on the module substrate are allowed to function.

From the viewpoint of securing reliability in the electronic devices such as those mentioned above, it is required that the connection between the module substrates and the motherboard and the connection between the electronic components and module substrates be hard to break. Therefore, the module substrates and the like used for connecting with the motherboard and terminals forming their joints are demanded to be excellent in solder joint strength which is evaluated by a solder ball pull test. In response to such demands, it has been proposed to optimize the composition and thickness of plating films disposed on surfaces of terminals (see, for example, Japanese Patent Application Laid-Open No. 2008-177261).

SUMMARY OF THE INVENTION

Meanwhile, module substrates and electronic components incorporated in the electronic devices are required to have various characteristics according to purposes of the electronic devices. Therefore, terminals of module substrates such as those mentioned above are demanded to have different characteristics according to purposes of the electronic devices. For example, it is necessary for electronic devices such as mobile phones which are carried daily, printed wiring boards and module substrates incorporated therein, and terminals provided therewith to have durability to withstand shocks caused by falling.

However, as a result of studies, the inventors have found that, when a module substrate or the like is solder-joined and mounted to a motherboard by using a terminal structure formed by a conventional method, even the terminal structure having excellent solder joint strength is easy to break upon a shock caused by falling or the like.

In view of the circumstances mentioned above, it is an object of the present invention to provide a terminal structure, a printed wiring board, and a module substrate which can achieve sufficiently excellent drop strength when connected by soldering or the like. It is another object of the present invention to provide an electronic device which, by mounting such a printed wiring board and module substrate, does not easily break electric connections even when a shock of falling or the like is applied thereto.

For achieving the above-mentioned objects, the present invention provides a terminal structure comprising a terminal having a conductor containing at least one metal selected from the group consisting of gold, silver, and copper, a first layer, disposed on the conductor, containing phosphorus and nickel, and a second layer, disposed on the first layer, having a nickel/phosphorus atomic ratio smaller than that of the first layer and containing $Ni_3P$; and solder disposed on the second layer of the terminal; wherein the second layer has a thickness of at least 0.35 µm.

The terminal structure of the present invention and the printed wiring board and module substrate having this terminal structure can achieve sufficiently excellent drop strength. The electronic device mounted with the printed wiring board and module substrate having such a terminal structure do not easily break electric connections even when the shock of falling or the like is applied thereto. It is not completely clear why such an effect is obtained, but the inventors infer as follows.

The terminal structure of the present invention has the first layer containing phosphorus and nickel and the second layer, disposed on the first layer, having a nickel/phosphorus atomic ratio smaller than that of the first layer and containing $Ni_3P$, while the second layer has a thickness of a specific value or greater. Since the second layer containing $Ni_3P$ is thicker, the terminal structure of the present invention can inhibit nickel of the second layer from diffusing to solder when joining the printed wiring board and module substrate with the solder. This can make the second layer harder to corrode and restrain voids from occurring. This seems to be able to yield a terminal structure, a printed wiring board, and a module substrate which can achieve sufficiently excellent drop strength. This also seems to make it possible to yield an electronic device which does not easily break electric connections even when a shock of falling or the like is applied thereto.

The solder ball pull strength, which is an index indicating the adhesion strength of a solder ball disposed on a terminal, hardly depends on the thickness of the second layer. On the other hand, as mentioned above, the drop strength of the terminal structure having the solder and the printed wiring board and module substrate having this terminal structure greatly depends on the thickness of the second layer. This seems to result from the fact that, unlike the ball pull strength, the drop strength is susceptible to the fine structure at the joint between the solder and terminal.

That is, the present invention is based on the inventors' original finding that the second layer containing $Ni_3P$ is required to have a large thickness in order to improve the drop strength of the terminal structure. Making a specific layer structure and setting the thickness of the second layer containing $Ni_3P$ to a specific value or greater according to such finding can yield a terminal having sufficiently excellent drop strength. Such a drop strength improving effect is obtained remarkably in particular when Sn—Ag—Cu-based solder, which becomes hard and is likely to break upon the shock of falling or the like, is used in place of Sn—Pb-based solder.

Preferably, the terminal structure of the present invention further comprises a third layer containing an intermetallic compound between the second layer of the terminal and the solder. This can further enhance the joint strength between the terminal and solder, so as to yield a terminal structure which can achieve further excellent drop strength.

Preferably, in the terminal structure of the present invention, the second layer has a part where the $Ni_3P$ content becomes higher as the solder is nearer. This makes it further harder for nickel to diffuse from the second layer into the solder at the time of connection with a reflow, whereby voids can further fully be inhibited from occurring. Accordingly, it is possible to yield a terminal structure which can achieve further excellent drop strength.

Preferably, in the terminal structure of the present invention, the second layer has a lead content of 100 ppm or less. This can fully inhibit lead from being eluted from the second layer into plating solutions at the time of electroless palladium and gold plating steps, whereby the phosphorus content can be restrained from locally fluctuating in the surface of the second layer.

The present invention also provides a printed wiring board having the above-mentioned terminal structure, and a module substrate having the above-mentioned terminal structure and an electronic instrument electrically connected to the conductor of the terminal structure. The printed wiring board and module substrate of the present invention include the terminal structure having characteristic features mentioned above and thus can achieve excellent drop strength when mounted to electronic devices.

The present invention further provides an electronic device mounted with at least one of the above-mentioned printed wiring board and module substrate. The electronic device is mounted with the printed wiring board or module substrate including the terminal structure having the above-mentioned characteristic features and thus can fully inhibit electric connections from breaking even when the shock of falling or the like is applied thereto.

The present invention can provide a terminal structure, a printed wiring board, and a module substrate which can achieve sufficiently excellent drop strength. The present invention can also provide an electronic device which, by mounting the printed wiring board and the module substrate, does not easily break electric connections even when the shock of falling or the like is applied thereto.

DESCRIPTION OF THE PREFERRED EMBODIMENTS

In the following, preferred embodiments of the present invention will be explained with reference to the drawings as the case may be. In the drawings, the same or equivalent constituents will be referred to with the same signs while omitting their overlapping descriptions.

Figure 1:
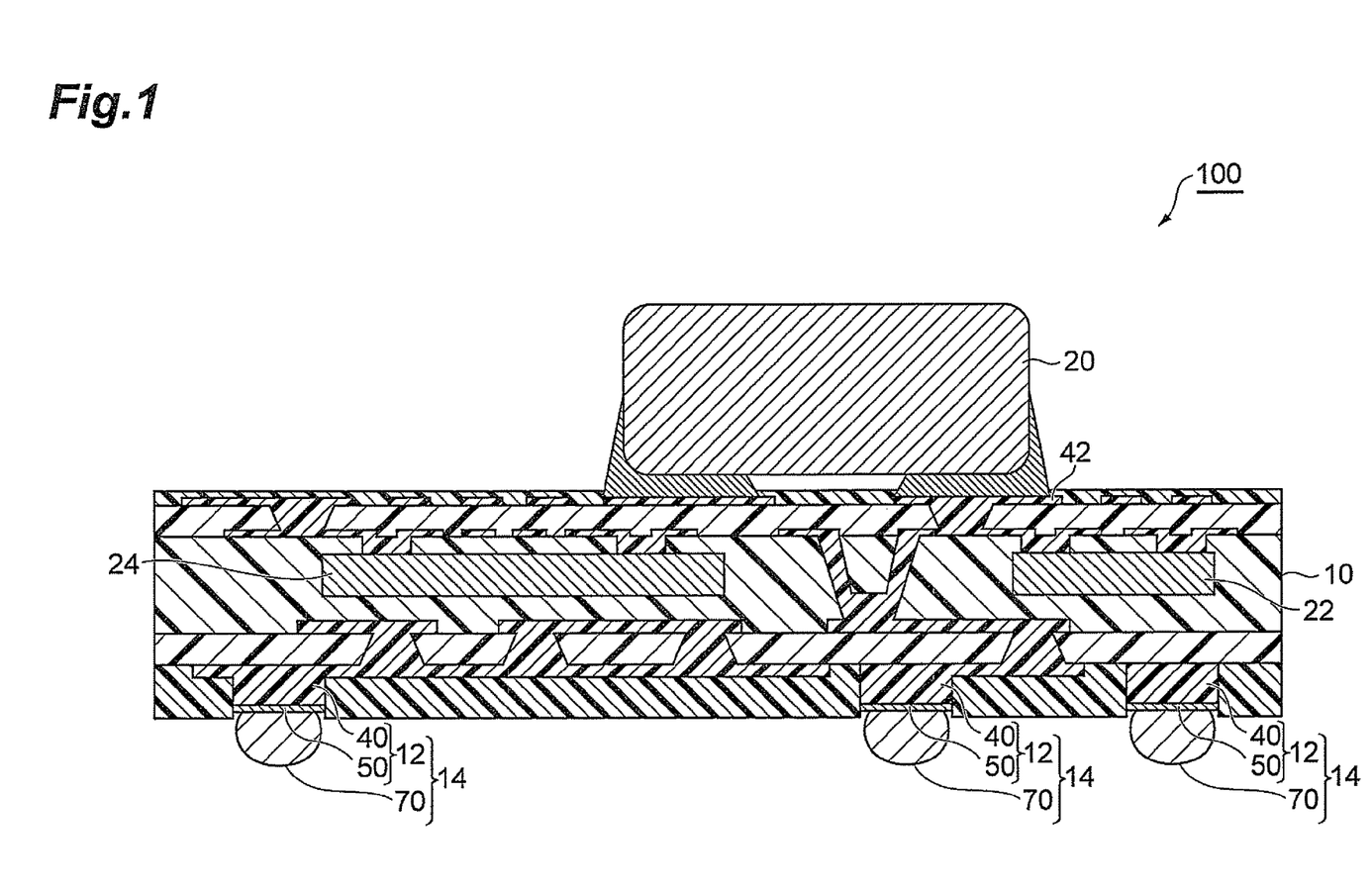
FIG. 1 is a sectional view schematically illustrating a preferred embodiment of the module substrate in accordance with the present invention.

FIG. 1 is a sectional view schematically illustrating a preferred embodiment of the module substrate in accordance with the present invention.

This module substrate 100 has a chip capacitor 20 disposed on one surface of a substrate 10, while the chip capacitor 20 is connected to copper terminals 42. A capacitor 22 and an IC chip 24 are embedded in the substrate 10 and connected to each other with copper wiring.

The module substrate 100 has terminal structures 14 on the other surface of the substrate 10. Each terminal structure 14 has a terminal 12 constituted by a copper terminal 40 disposed on the substrate 10 and a coating layer 50 disposed on the copper terminal 40, and a solder ball 70 attached to the terminal 12.

Figure 2:
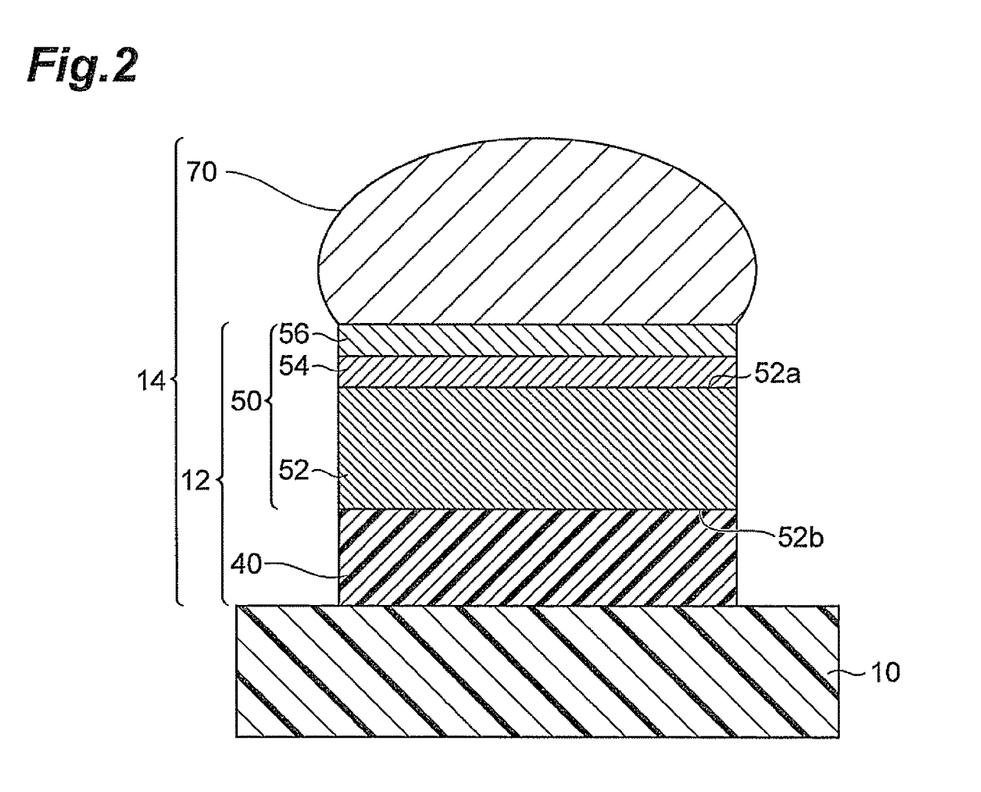
FIG. 2 is a sectional view schematically illustrating a preferred embodiment of the terminal structure of the present invention.

FIG. 2 is a sectional view schematically illustrating a preferred embodiment of the terminal structure of the present invention. That is, FIG. 2 illustrates a cross-sectional structure of the terminal structure 14 in the module substrate 100. The terminal structure 14 is constructed such that a first layer 52 containing phosphorus and nickel, a second layer 54 having a nickel/phosphorus atomic ratio smaller than that of the first layer 52 and containing $Ni_3P$ as a main component, and a third layer 56 containing an intermetallic compound as a main component are laminated on the copper terminal 40 disposed on the substrate 10 in this order from the copper terminal 40 side.

The first layer 52 contains nickel, phosphorus, and their compounds as main components, while the phosphorus content in the first layer 52 as a whole is preferably 10 to 30 atomic %, more preferably 15 to 25 atomic %. The nickel content in the first layer 52 as a whole is preferably 70 to 90 atomic %, more preferably 75 to 85 atomic %. The first layer 52 may contain additives (e.g., palladium, gold, and copper) other than the above-mentioned main components. However, the content of the main components in the first layer 52 is preferably at least 90 atomic %, more preferably at least 95 atomic %, further preferably at least 99 atomic %.

The phosphorus content and nickel content may vary thickwise in the first layer 52. For example, it may have a layer in which the phosphorus content becomes lower as the solder ball 70 is nearer.

From the viewpoint of attaining favorable joint strength and drop strength at the same time, the thickness of the first layer 52 is preferably 1 to 20 μm, more preferably 2 to 10 μm, further preferably 2 to 6 μm. The first layer 52 can be formed by electroless nickel plating.

The second layer 54 is a layer having a nickel/phosphorus atomic ratio smaller than that of the first layer 52 and contains $Ni_3P$ as a main component. The $Ni_3P$ content in the second layer 54 as a whole is preferably at least 80 mass %, more preferably at least 90 mass %, further preferably at least 95 mass %. As the $Ni_3P$ content in the second layer 54 is higher, nickel can be more inhibited from diffusing into the solder 70 at the time of solder-joining, whereby a solder joint more excellent in drop strength can be formed. The second layer 54 may have a part in which the $Ni_3P$ content becomes higher as the solder 70 is nearer.

From the viewpoint of attaining favorable joint strength and drop strength at the same time, the thickness of the second layer 54 is preferably at least 0.4 μm, more preferably at least 0.45 μm, further preferably at least 0.5 μm. Though there is no particular upper limit for the thickness of the second layer 54, it is preferably 2 μm or less, more preferably 1 μm or less, from the viewpoint of reducing the sizes of the printed wiring board and module substrate. The second layer 54 is made by performing electroless nickel plating, electroless palladium plating, and electroless gold plating in this order, so as to form a plating film, and then heating the plating film together with a solder ball mounted thereon. Changing conditions for electroless nickel plating and heating can adjust the thicknesses of the first and second layers 52, 54.

The third layer 56 is a layer including an intermetallic compound formed by interdiffusion in a thermal history during a manufacturing step and preferably contains $(Cu, Ni)_6Sn_5$. The third layer 56 functions to buffer the shock of falling between the second layer 54 and solder ball 70 containing respective elements different from each other. Thus, the drop strength can be improved. The third layer may contain additives, such as an alloy of Cu and Ni, other than the intermetallic compound. However, the intermetallic compound content in the third layer 56 is preferably at least 80 mass %, more preferably at least 90 mass %, further preferably at least 95 mass %.

From the viewpoint of attaining favorable joint strength and drop strength at the same time, the thickness of the third layer 56 is preferably 1 to 3 μm, more preferably 1.5 to 2.5 μm. The third layer 56 is made by performing electroless nickel plating, electroless palladium plating, and electroless gold plating in this order, so as to form a plating film, and then heating the plating film together with a solder ball mounted thereon. Changing conditions for the thickness, composition, and heating of electroless nickel plating can adjust the thickness of the third layer 56.

The solder ball 70 is preferably lead-free Sn—Ag—Cu-based solder, for example, more preferably solder having a composition of Sn-3Ag-0.5Cu. This can yield a terminal structure which sufficiently reduces the fear of environment pollution.

From the viewpoint of attaining favorable joint strength and drop strength at the same time, the thickness of the solder ball 70, i.e., its length in the laminating direction of the first to third layers, is preferably 0.2 to 2 μm, more preferably 0.4 to 1 μm.

The compositions of the copper terminal 40, first layer 52, second layer 54, third layer 56, and solder ball 70 can be measured by analyzing the cross sections of the layers and ball with a commercially available EDS system. The ratio of change in the content of an element in the thickness direction of each layer can be determined by measuring the content of the element along the thickness direction with an X-ray photoelectron spectroscopy (XPS) system.

The substrate 10 in the module substrate 100 may be either a resin substrate made of an epoxy resin or the like or a glass-ceramics substrate. In the case of a resin substrate, the substrate 10 can be formed by subjecting a commercially available printed wiring board, to which electronic components such as filters and capacitors are connected when necessary, to copper through-hole plating. In the case of a glass-ceramics substrate, the substrate 10 can be made as follows. First, using a dielectric paste containing a glass powder, a binder, a solvent, a plasticizer, a dispersant, and the like, a green sheet is formed by doctor blading or the like. Subsequently, a conductive paste containing a conductive material made of any of various conductive metals and alloys such as Ag, Ag—Pd alloys, Cu, and Ni and an organic vehicle is applied onto the green sheet, via holes are formed therein, and so forth, so as to make a conductor pattern having a predetermined form. Thereafter, a plurality of green sheets formed with conductor patterns are laminated when necessary, pressed, and fired, whereby a multilayer glass-ceramics substrate can be obtained. A monolayer glass-ceramics substrate can be obtained by firing without the above-mentioned lamination.

The substrate 10 may be provided with various electronic components such as filters, ICs, and capacitors. Connecting these electronic components to electrode terminals of the substrate 10 with solder and the like yields the module substrate 100.

A method of forming the terminal structure 14 of the module substrate 100 will now be explained. First, the commercially-available substrate 10 or the substrate 10 made by a known method is prepared. A plating film was formed on the copper terminal 40 of the substrate 10 by the following steps. That is, a degreasing step for degreasing the surface of the copper terminal 40, a pre-dip step, an activation step, a post-dip step, an electroless nickel plating step, an electroless palladium plating step, and an electroless gold plating step are carried out in this order, so as to form the plating film.

The degreasing step may be carried out with a commercially available degreasing solution. Preferably, the copper terminal 40 of the module substrate 100 is immersed in the degreasing solution, then taken out therefrom, and washed with water.

The pre-dip step may use an activation solution identical to that employed in the subsequent activation step. Performing the pre-dip step can inhibit the concentration of effective components in the activation solution in the activation step from fluctuating.

The activation step may be carried out with a commercially available activation solution. The post-dip step may be carried out with a commercially available post-dip solution. The post-dip step can remove palladium components and the like attached to nonconductor parts in the previous step.

The electroless nickel plating step immerses the copper terminal 40 into a commercially available electroless nickel plating solution, so as to form an electroless nickel plating film. Here, the temperature of the electroless nickel plating solution is preferably 50 to 95° C., more preferably 60 to 90° C. The phosphorus content in the electroless nickel plating solution is preferably 10 to 13 mass %. Preferably, the pH of the electroless nickel plating solution is adjusted to 5.0 to 6.0 with dilute sulfuric acid or aqueous ammonia, for example.

The electroless palladium plating step forms an electroless palladium plating film having a thickness of 0.01 to 0.2 μm on the surface of the electroless nickel plating film by using a commercially available electroless palladium plating solution. Thus forming the electroless palladium plating film can inhibit the electroless nickel plating film from corroding at the time of carrying out displacement gold plating.

The electroless gold plating step forms a gold plating film by using a commercially available electroless gold plating solution. Here, since the phosphorus content in the nickel plating film is high, nickel is restrained from being eluted, whereby the corrosion of the electroless nickel plating film can fully be suppressed.

The foregoing steps can form a plating film in which a nickel plating layer made of an electroless nickel plating film, a palladium plating layer made of an electroless palladium plating film, and a gold plating layer made of an electroless gold plating film are laminated in this order on the copper terminal 40.

Next, a solder ball is attached to the surface of the plating film on the side opposite from the copper terminal 40 with a commercially available flux. Then, they are heated at a temperature of 220 to 250° C. for 1 to 5 min, whereby the terminal structure 14 illustrated in FIG. 2 can be formed.

A method of connecting the module substrate in accordance with another embodiment of the present invention to a motherboard will now be explained.

Figure 3:
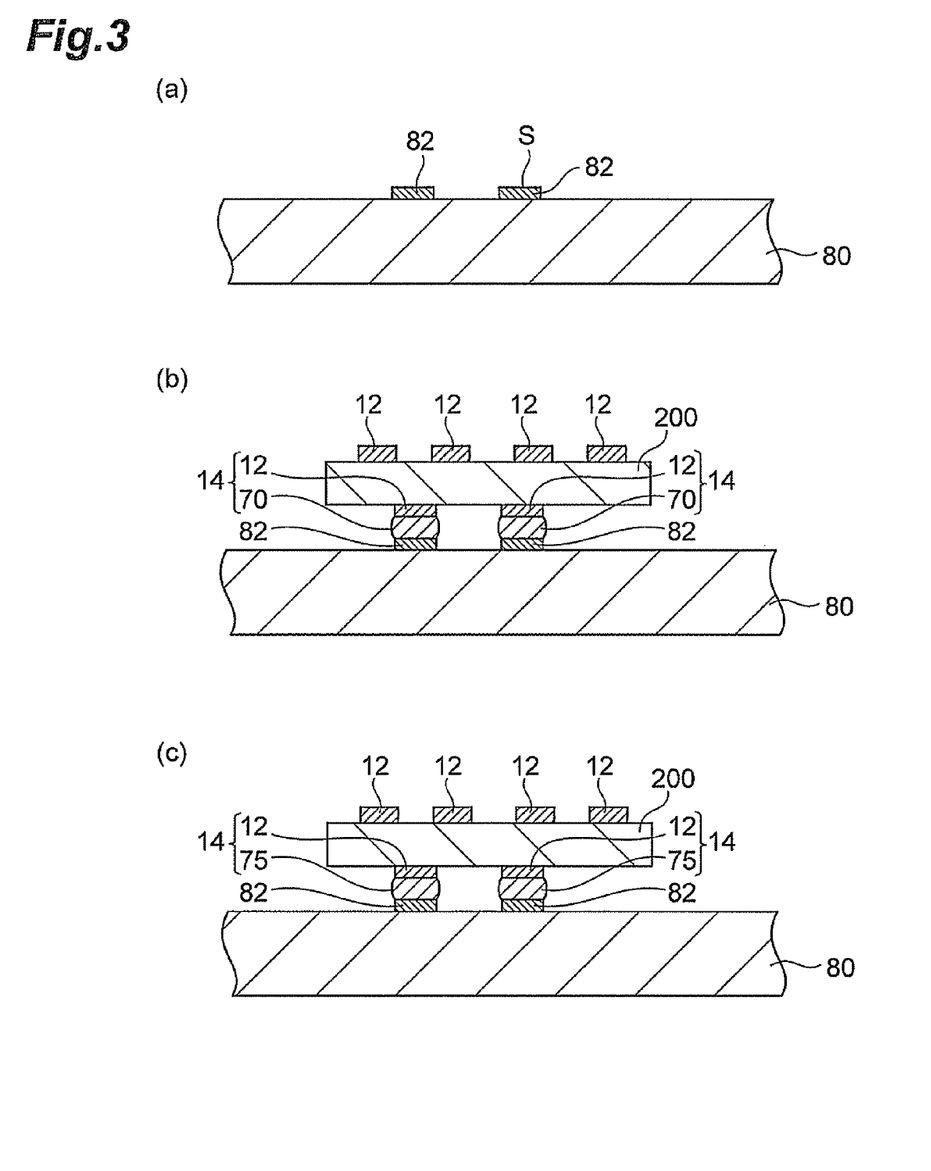
FIG. 3 is a process drawing schematically illustrating a method of connecting a module substrate which is an embodiment of the present invention to a motherboard.
Figure 4:
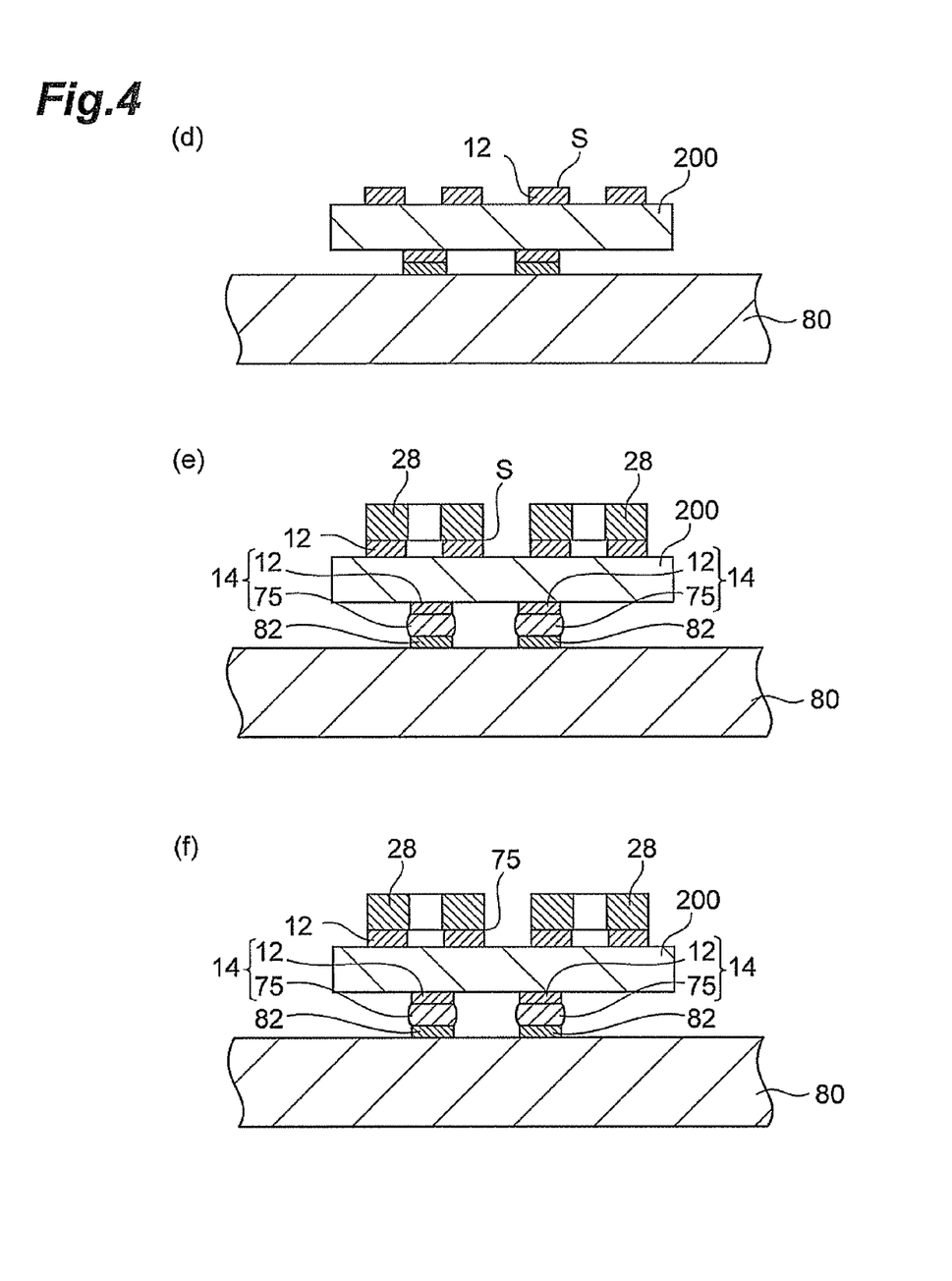
FIG. 4 is a process drawing schematically illustrating the method of connecting the module substrate that is an embodiment of the present invention to the motherboard.

FIGS. 3 and 4 are process drawings schematically illustrating the method of connecting a module substrate 200 which is an embodiment of the present invention to a motherboard 80. This connecting method comprises a first solder application step [FIG. 3(a)], a substrate mount step [FIG. 3(b)], a first solder reflow step [FIG. 3(c)], a second solder application step [FIG. 4(d)], a component mount step [FIG. 4(e)], and a second solder reflow step [FIG. 4(f)]. The method of connecting the module substrate 200 to the motherboard 80 will now be explained with reference to FIGS. 3 and 4.

The first solder application step of FIG. 3(a) prepares the motherboard 80 having electrode terminals 82. Cream solder S is applied to the surface of each electrode terminal 82. The cream solder S may be applied by printing through a metal mask. The cream solder S is not limited to any specific kind in particular; one containing Sn—Pb— or Sn—Ag—Cu-based solder may be used.

The substrate mount step of FIG. 3(b) causes the rear face of the module substrate 200 having the terminals 12 and solder balls 70 and the front face of the motherboard 80 to oppose each other, aligns the electrodes 12 with their corresponding electrode terminals 82 such that they come into contact with each other through the solder balls 70 and cream solder S, and mounts the module substrate 200 onto the motherboard 80.

The first solder reflow step of FIG. 3(c) heats the motherboard 80 and the module substrate 200 mounted on the motherboard 80 in a solder reflow furnace and then cools them. The cream solder S and solder balls 70 are melted by the heating and then solidified by the cooling, whereby the terminals 12 and their corresponding electrode terminals 82 are connected to each other. As a consequence, the module substrate 200 and the motherboard 80 are connected and integrated to each other.

Figure 5:
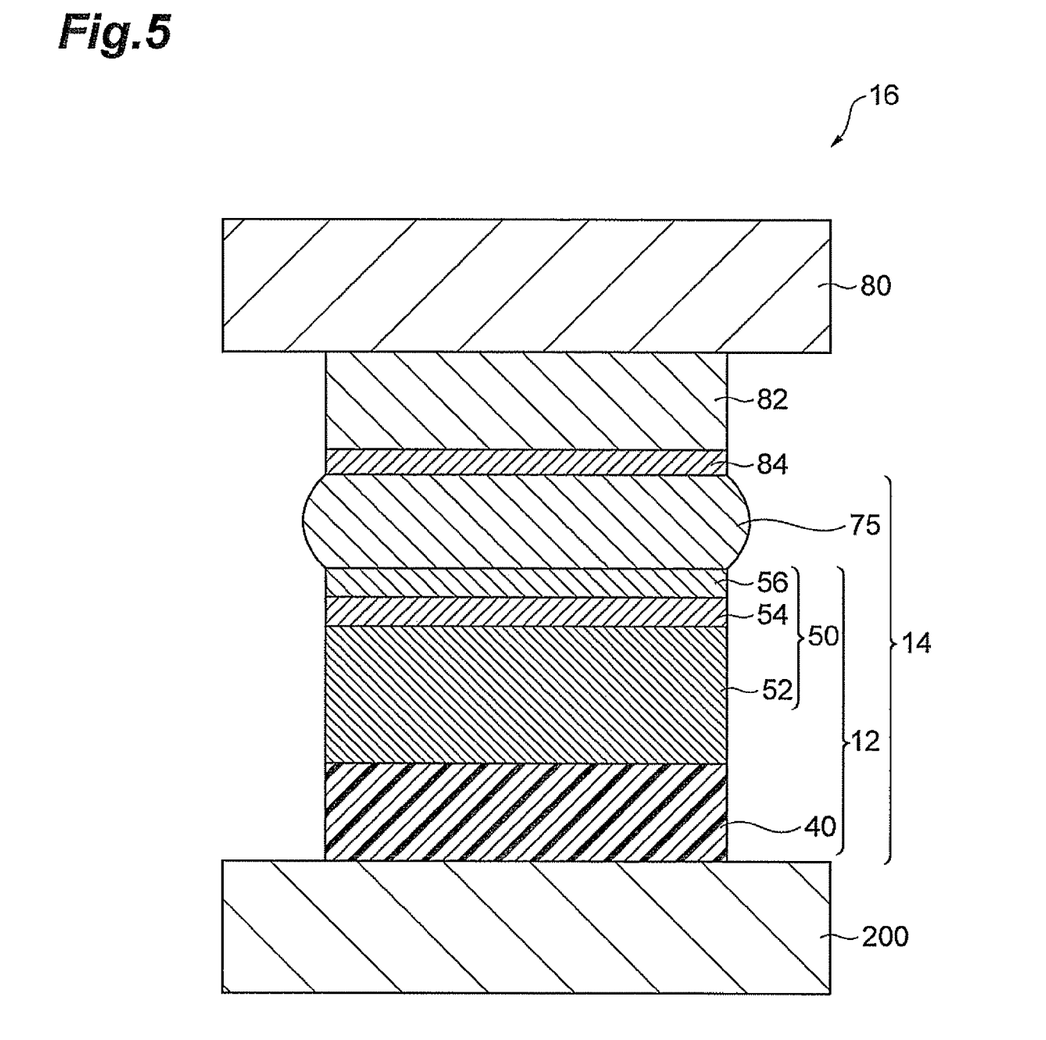
FIG. 5 is a sectional view schematically illustrating an embodiment of the terminal structure of the present invention.

FIG. 5 is a sectional view schematically illustrating the terminal structure of this embodiment. That is, FIG. 5 illustrates the structure of a joint between the module substrate 200 and motherboard 80 after the first solder reflow step. The first solder reflow step melts the solder ball 70 and cream solder S, so as to form a solder layer 75, thereby connecting the terminal 12 of the module substrate 200 and the electrode terminal 82 of the motherboard 80 to each other. Thus, a joint 16 is formed. Here, the second layer 54, disposed on the solder layer 75 side of the terminal structure 14, containing $Ni_3P$ as a main component, is thick enough to inhibit nickel from diffusing into the solder layer 75. This can restrain voids from occurring in the second layer 54 and the like.

The joint 16 further has the third layer 56 containing an intermetallic compound as a main component between the solder layer 75 and second layer 54 and thus can inhibit cracks from occurring in the interface between the solder layer 75 and the terminal 12. Therefore, sufficiently excellent drop strength can be achieved even when the cream solder S and solder ball 70 containing Sn—Ag—Cu-based solder is used. The palladium plating layer and gold plating layer typically diffuse palladium and gold into the solder ball 70 and are integrated with the solder layer 75.

The second solder application step of FIG. 4(d) applies the cream solder S onto the terminals 12 of the module substrate 200 which is the integrated state with the motherboard 80. The cream solder S may be applied by printing through a metal mask.

The component mount step of FIG. 4(e) mounts electronic components 28 on the terminals 12 coated with the cream solder S such that the terminals 12 oppose their corresponding terminals of the electronic components 28.

The second solder reflow step of FIG. 4(f) heats the motherboard 80 and module substrate 200 mounted with the electronic components 28 in a solder reflow furnace and then cools them. The cream solder S is melted by the heating and then solidified by the cooling, whereby the terminals 12 are connected to their corresponding electronic components 28 through the respective solder layers 75. That is, the joint 16 illustrated in FIG. 5 is formed between each terminal 12 and its corresponding electronic component 28.

As mentioned above, when connecting the module substrate of this embodiment to a motherboard, nickel is sufficiently inhibited from diffusing from the first layer 52 and second layer 54 into the solder layer 75, since the terminal structure of the module substrate has the second layer 52 having a large thickness. This can fully restrain voids from occurring in the joint 16, near the interface between the solder layer 75 and the terminal 12 in particular. Thus, the module substrate to be mounted is sufficiently inhibited from generating voids in the joint with respect to the motherboard and has the third layer containing an intermetallic compound as a main component in the vicinity of the interface between the solder layer 75 and the terminal 12, and thus is hard to break even when the shock of falling or the like is applied thereto. Therefore, an electronic device in which the module substrate to be mounted has the above-mentioned structure of connection exhibits excellent durability to withstand the shock of falling or the like. Hence, the above-mentioned module substrate can favorably be mounted to electronic devices such as mobile phones, portable personal computers, and portable game machines in particular. Such electronic devices have excellent durability to withstand shocks of falling and the like.

Though preferred embodiments of the present invention have been explained in the foregoing, the present invention is not limited to the above-mentioned embodiments at all. For example, while the above-mentioned embodiments have been explained by using module substrates, the terminal structure of the present invention may be provided with monolayer or multilayer printed wiring boards mounted with no electronic instruments.

EXAMPLES

The present invention will now be explained in more detail with reference to examples and comparative examples, but is not limited to the following examples.

Example 1

A highly heat-resistant substrate (manufactured by Hitachi Chemical Co., Ltd. under the product name of FR-4 having a thickness of 3 mm) which was a packaging substrate was prepared. The substrate was formed with a through hole by using an NC drill and subjected to copper through-hole plating. Then, an etching resist having a predetermined form was made, and unnecessary copper wiring was removed by etching, so as to form a daisy-chain circuit pattern. Thereafter, the surface of the substrate was partly overcoated with a solder resist such that no plating was deposited on unnecessary parts, so as to form a copper pad (having a diameter of 0.6 mm) for connecting with a solder ball.

A silicon dummy wafer having a thickness of 0.3 mm was bonded to one surface of the substrate with an adhesive. Then, they were sealed with a resin, so as to yield a substrate having a total thickness of 1.1 mm. This substrate was sequentially subjected to steps which will be explained in the following, so as to form a plating film on the copper pad of the substrate.

Degreasing Step

The above-mentioned substrate was immersed in a degreasing solution (manufactured by Okuno Chemical Industries Co., Ltd. under the product name of Ace Clean 850) at 40° C. for 3 min, then taken out therefrom, and washed with water for 1 min.

Pre-Dip Step

The substrate was immersed in NNP Accera B (product name manufactured by Okuno Chemical Industries Co., Ltd.) at 25° C. for 30 sec. This step was performed in order to inhibit the content of each component in a plating bath used in the subsequent step from decreasing.

Activation Step

The substrate was immersed in a plating activation solution (manufactured by Okuno Chemical Industries Co., Ltd. under the product name of NNP Accera) at 35° C. for 5 min. Then, the substrate was taken out from the plating activation solution and washed with water for 1 min.

Post-Dip Step

The substrate was immersed in NNP Post Dip 401 (product name manufactured by Okuno Chemical Industries Co., Ltd.) at 25° C. for 2 min, so as to remove Pd components attached to nonconductor parts in the substrate.

Electroless Nickel Plating Step

The pH of an electroless nickel plating solution (manufactured by Okuno Chemical Industries Co., Ltd. under the product name of SOF bath having a phosphorus content of 12 mass %) was adjusted to 5.4 with aqueous ammonia, and the substrate was immersed in thus adjusted electroless nickel plating solution at 85° C. for 20 min, so as to form an electroless nickel plating film on the copper pad. The phosphorus content based on the total of nickel and phosphorus in the electroless nickel plating solution was 12 mass %. Thereafter, the substrate was taken out from the electroless nickel plating solution and washed with water for 1 min.

Electroless Palladium Plating Step

The substrate was immersed in an electroless Pd plating solution (manufactured by Okuno Chemical Industries Co., Ltd. under the product name of Palla Top N bath having a phosphorus content of 0 mass %) at 60° C. for 3 min. Thereafter, the substrate was taken out from the electroless Pd plating solution and washed with water for 1 min.

Electroless Gold Plating Step

The substrate was immersed in an electroless gold plating solution (manufactured by Okuno Chemical Industries Co., Ltd. under the product name of Flash Gold 330 bath) at 85° C. for 25 min and washed with water for 1 min. Thereafter, the substrate was taken out from the electroless gold plating solution and washed with water for 1 min.

The foregoing steps formed a plating film having a nickel plating layer having a phosphorus content of 12 mass % and a gold plating layer on the copper terminal of the substrate in this order from the copper pad side. The substrate having a terminal comprising the copper pad and plating film was obtained.

Evaluation of Plating Film

A cross section of the plating film of the terminal was mirror-polished and then observed with a scanning electron microscope (SEM). By analyzing it with an energy dispersive X-ray spectroscopy (EDS) system (manufactured by JEOL Ltd. under the product name of JXA-8500F) attached to the SEM, the phosphorus content and lead content in the nickel plating layer were determined. Table 1 lists the results.

The cross section of the same plating film was observed with a transmission electron microscope (TEM), so as to determine the thickness of each plating layer. The thickness of each plating layer was measured at three different positions selected on an image observed with the TEM, and their average value was determined as the thickness indicated in Table 1.

Example 2

A plating film having a nickel plating layer, a palladium plating layer, and a gold plating layer on the copper pad of the substrate in this order from the copper pad side was formed as in Example 1 except that an electroless palladium plating solution having a phosphorus content of 1 mass % was used in place of the one having a phosphorus content of 0 mass % in the electroless palladium plating step and that the time for immersion in the palladium plating solution was 5 min so as to increase the thickness of the palladium layer. Then, the plating film was evaluated as in Example 1. Table 1 lists the results.

Example 3

Aqueous ammonia was added to the electroless nickel plating solution used in the electroless nickel plating step of Example 1, so as to adjust its pH and phosphorus content. In the electroless nickel plating solution after the adjustment, the pH was 5.6, while the phosphorus content based on the total of nickel and phosphorus was 11 mass %. A plating film having a nickel plating layer and a gold plating layer on a copper terminal of a substrate in this order from the copper terminal side was formed as in Example 1 except that the electroless nickel plating solution prepared as mentioned above was used in the electroless nickel plating step. Then, the plating film was evaluated as in Example 1. Table 1 lists the results.

Example 4

A plating film was formed on a copper pad of a substrate as in Example 3 except that an electroless palladium plating solution having a phosphorus content of 1 mass % was used in place of the one having a phosphorus content of 0 mass % in the electroless palladium plating step and that the time for immersion in the palladium plating solution was 5 min so as to increase the thickness of the palladium layer. Then, the plating film was evaluated as in Example 1. Table 1 lists the results.

Comparative Example 1

Aqueous ammonia was added to the electroless nickel plating solution used in the electroless nickel plating step of Example 1, so as to prepare an electroless nickel plating solution having a phosphorus content of 9 mass % based on the total of nickel and phosphorus. A plating film having a nickel plating layer, a palladium plating layer, and a gold plating layer on a copper terminal of a substrate in this order from the copper terminal side was formed as in Example 1 except that the electroless nickel plating solution having a phosphorus content of 9 mass % prepared as mentioned above was used in the electroless nickel plating step. Then, the plating film was evaluated as in Example 1. Table 1 lists the results.

Comparative Example 2

Aqueous ammonia was added to the electroless nickel plating solution used in the electroless nickel plating step of Example 1, so as to adjust its pH and phosphorus content. In the electroless nickel plating solution after the adjustment, the pH was 4.5, while the phosphorus content based on the total of nickel and phosphorus was 7 mass %. A plating film was formed on a copper pad of a substrate as in Example 1 except that the electroless nickel plating solution having a phosphorus content of 7 mass % prepared as mentioned above was used in the electroless nickel plating step. Then, the plating film was evaluated as in Example 1. Table 1 lists the results.

Comparative Example 3

A plating film was formed on a copper pad of a substrate as in Example 1 except that an electroless palladium plating solution having a phosphorus content of 7 mass % was used in place of the one having a phosphorus content of 0 mass % in the electroless palladium plating step. Then, the plating film was evaluated as in Example 1. Table 1 lists the results.

Comparative Example 4

Aqueous ammonia was added to the electroless nickel plating solution used in the electroless nickel plating step of Example 1, so as to adjust its pH and phosphorus content. In the electroless nickel plating solution after the adjustment, the pH was 4.4, while the phosphorus content based on the total of nickel and phosphorus was 5 mass %. A plating film was formed on a copper pad of a substrate as in Example 1 except that the electroless nickel plating solution having a phosphorus content of 5 mass % prepared as mentioned above was used in the electroless nickel plating step and that an electroless palladium plating solution having a phosphorus content of 1 mass % was used in the electroless palladium plating step. Then, the plating film was evaluated as in Example 1. Table 1 lists the results.

Comparative Example 5

Aqueous ammonia was added to the electroless nickel plating solution used in the electroless nickel plating step of Example 1, so as to adjust its pH and phosphorus content. In the electroless nickel plating solution after the adjustment, the pH was 4.4, while the phosphorus content based on the total of nickel and phosphorus was 5 mass %. A plating film was formed on a copper pad of a substrate as in Example 1 except that the electroless nickel plating solution having a phosphorus content of 5 mass % prepared as mentioned above was used in the electroless nickel plating step. Then, the plating film was evaluated as in Example 1. Table 1 lists the results.

Comparative Example 6

Aqueous ammonia was added to the electroless nickel plating solution used in the electroless nickel plating step of Example 1, so as to adjust its pH and phosphorus content. In the electroless nickel plating solution after the adjustment, the pH was 4.4, while the phosphorus content based on the total of nickel and phosphorus was 5 mass %. A plating film was formed on a copper pad of a substrate as in Example 1 except that the electroless nickel plating solution having a phosphorus content of 5 mass % prepared as mentioned above was used in the electroless nickel plating step and that the time for immersion in the palladium plating solution was 15 min so as to increase the thickness of the palladium layer. Then, the plating film was evaluated as in Example 1. Table 1 lists the results.

Comparative Example 7

A plating film was formed on a copper pad of a substrate as in Comparative Example 4 except that the time for immersion in the palladium plating solution was 15 min so as to increase the thickness of the palladium layer. Then, the plating film was evaluated as in Example 1. Table 1 lists the results.

Comparative Example 8

Aqueous ammonia was added to the electroless nickel plating solution used in the electroless nickel plating step of Example 1, so as to adjust its pH and phosphorus content. In the electroless nickel plating solution after the adjustment, the pH was 4.4, while the phosphorus content based on the total of nickel and phosphorus was 5 mass %. A plating film was formed on a copper pad of a substrate as in Example 1 except that the electroless nickel plating solution having a phosphorus content of 5 mass % prepared as mentioned above was used in the electroless nickel plating step and that an electroless palladium plating solution having a phosphorus content of 6 mass % was used in the electroless palladium plating step. Then, the plating film was evaluated as in Example 1. Table 1 lists the results.

Comparative Example 9

A plating film was formed on a copper pad of a substrate as in Comparative Example 8 except that the time for immersion in the palladium plating solution was 15 min so as to increase the thickness of the palladium layer. Then, the plating film was evaluated as in Example 1. Table 1 lists the results.

Comparative Example 10

A plating film was formed on a copper pad of a substrate as in Comparative Example 4 except that the thickness of the gold plating film was increased by immersion in a reductive electroless gold plating solution after the electroless gold plating step. Then, the plating film was evaluated as in Example 1. Table 1 lists the results.

Comparative Example 11

Aqueous ammonia was added to the electroless nickel plating solution used in the electroless nickel plating step of Example 1, so as to adjust its pH and phosphorus content. In the electroless nickel plating solution after the adjustment, the pH was 4.4, while the phosphorus content based on the total of nickel and phosphorus was 5 mass %. A plating film was formed on a copper pad of a substrate as in Example 1 except that the electroless nickel plating solution having a phosphorus content of 5 mass % prepared as mentioned above was used in the electroless nickel plating step and that the thickness of the gold plating film was increased by immersion in a reductive electroless gold plating solution after the electroless gold plating step. Then, the plating film was evaluated as in Example 1. Table 1 lists the results.

Comparative Example 12

Aqueous ammonia was added to the electroless nickel plating solution used in the electroless nickel plating step of Example 1, so as to adjust its pH and phosphorus content. In the electroless nickel plating solution after the adjustment, the pH was 4.4, while the phosphorus content based on the total of nickel and phosphorus was 5 mass %. A plating film was formed on a copper pad of a substrate as in Example 1 except that the electroless nickel plating solution having a phosphorus content of 5 mass % prepared as mentioned above was used in the electroless nickel plating step and that an electroless palladium plating solution having a phosphorus content of 3 mass % was used in the electroless palladium plating step. Then, the plating film was evaluated as in Example 1. Table 1 lists the results.

Comparative Example 13

A plating film was formed on a copper pad of a substrate as in Comparative Example 12 except that the time for immersion in the palladium plating solution was 15 min so as to increase the thickness of the palladium film. Then, the plating film was evaluated as in Example 1. Table 1 lists the results.

Making of Evaluation Mounting Substrates

Separately from the above-mentioned package substrate, a substrate of 30 mm (L)×120 mm (W)×0.8 mm (T) formed with a daisy-chain circuit pattern was prepared. A cream solder paste (product name: M705-GRN360-MZ) manufactured by Senju Metal Industry Co., Ltd. was printed on an electrode terminal of this substrate. The dicer-cut package substrate was placed on this substrate such that their respective electrode terminals oppose each other through the solder ball and caused to pass through the reflow furnace once or twice (in which the first and second reflow processes will be referred to as reflow processes 1 and 2, respectively), and the package substrate was mounted on the substrate, so as to yield an evaluation mounting substrate.

TABLE 1

|  | Ni layer thickness μm | Pd layer thickness μm | Au layer thickness μm | P content in Ni layer mass % | Pb content in Ni layer mass % | P content in Pd layer mass % |
| --- | --- | --- | --- | --- | --- | --- |
| Example 1 | 3.15 | 0.11 | 0.03 | 12 | 0.000 | 0 |
| Example 2 | 3.73 | 0.16 | 0.09 | 12 | 0.000 | 1 |
| Example 3 | 3.40 | 0.10 | 0.07 | 11 | 0.000 | 0 |
| Example 4 | 3.20 | 0.12 | 0.05 | 11 | 0.000 | 1 |
| Comp. Ex. 1 | 5.89 | 0 | 0.48 | 9 | 0.031 | 0 |
| Comp. Ex. 2 | — | — | 0.05 | 7 | — | — |
| Comp. Ex. 3 | — | 0.10 | 0.10 | 7 | — | 7 |
| Comp. Ex. 4 | 6.08 | 0.10 | 0.06 | 5 | 0.029 | 1 |
| Comp. Ex. 5 | 5.30 | 0.20 | 0.03 | 5 | 0.015 | 0 |
| Comp. Ex. 6 | 5.00 | 0.44 | 0.05 | 5 | 0.028 | 0 |
| Comp. Ex. 7 | 5.96 | 0.53 | 0.03 | 5 | 0.019 | 1 |
| Comp. Ex. 8 | 5.76 | 0.15 | 0.05 | 5 | 0.028 | 6 |
| Comp. Ex. 9 | 5.68 | 0.47 | 0.05 | 5 | 0.035 | 6 |
| Comp. Ex. 10 | 6.20 | 0.10 | 0.47 | 5 | 0.021 | 1 |
| Comp. Ex. 11 | 5.68 | 0 | 0.47 | 5 | 0.019 | 0 |
| Comp. Ex. 12 | 5.73 | 0.13 | 0.03 | 5 | 0.024 | 3 |
| Comp. Ex. 13 | 6.16 | 0.58 | 0.03 | 5 | 0.034 | 3 |

In the table, "—" indicates unevaluated matters, and "P" indicates phosphorus.

Placing Solder Balls

Figure 6:
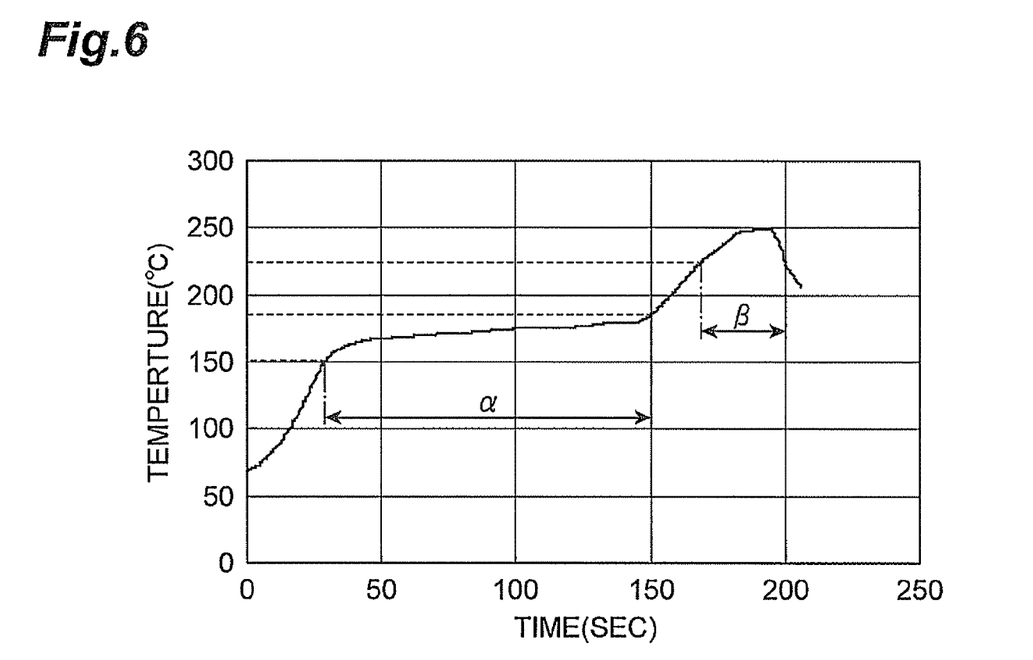
FIG. 6 is a graph illustrating a temperature profile of a reflow performed in each of examples and comparative examples.

A sparkle flux manufactured by Senju Metal Industry Co., Ltd. was printed on the plating film of each of the terminals formed by the examples and comparative examples, and then a solder ball having a diameter of 0.76 mm (product name: M705) manufactured by Senju Metal Industry Co., Ltd. was attached thereto. Thereafter, each product was caused to pass through a reflow furnace, so as to make a package substrate equipped with a terminal having the solder ball. The reflow condition was such that the preheat time α was 116.5 sec, the time β during which the temperature was 220° C. or higher was 30 to 40 sec, and the peak temperature was 230 to 255° C. FIG. 6 is a graph illustrating a temperature profile of a reflow for fixing the solder ball onto the plating film. The time during which the package substrate was heated to 230° C. or higher in the reflow was 25 sec. Thus obtained package substrate having the terminal and the solder ball fixed on the terminal was cut with a dicer into 10 mm sizes.

Solder Ball Pull Strength Test

As mentioned above, the solder ball pull strength of the terminal of the package substrate was determined by a commercially available solder bump pull strength tester (manufactured by Dage under the product name of #4000). The solder ball pull strength was determined 20 times by using different samples in each of the examples and comparative examples, and an average value was calculated for each set of the samples. Table 2 lists the results.

Evaluation of Layer Thickness

Figure 7:
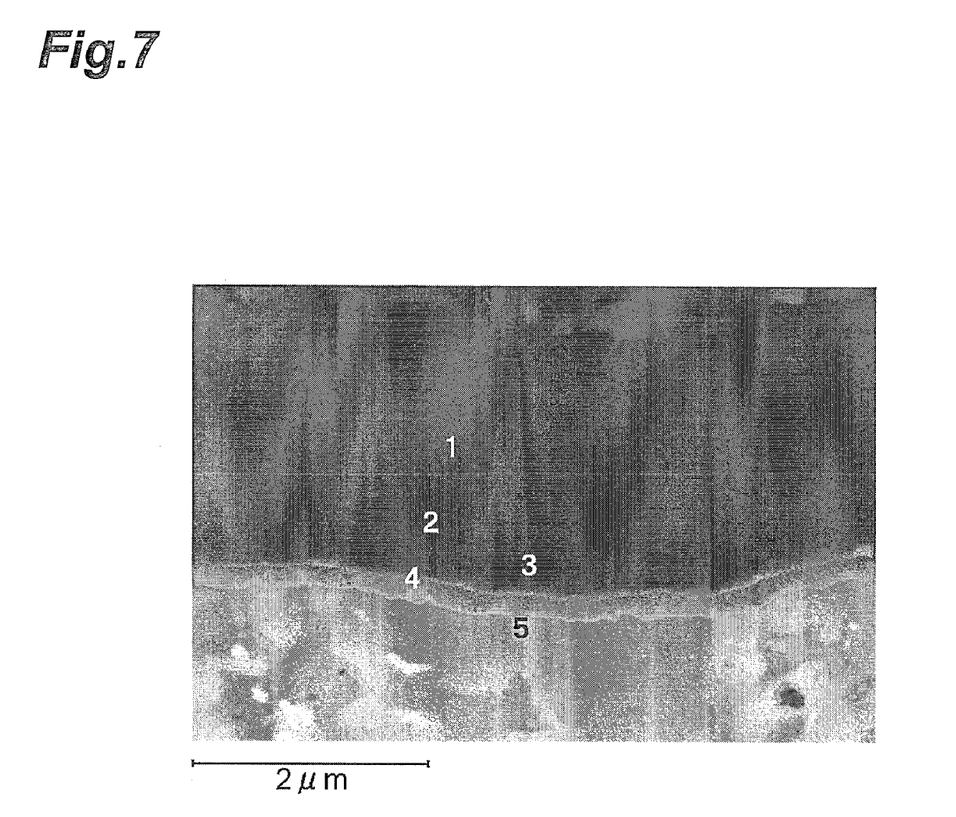
FIG. 7 is an EPMA (Electron Probe Micro Analyzer) observation photograph illustrating the structure of a joint between a package substrate and a substrate in Example 1.

The terminal structure in each of the evaluation mounting substrates of the examples and comparative examples was observed with an EPMA (Electron Probe Micro Analyzer). FIG. 7 is an EPMA (Electron Probe Micro Analyzer) observation photograph illustrating the structure of a joint between the package substrate and substrate in Example 1.

After each of the reflow processes 1 and 2, the cross-sectional structure of each of the evaluation mounting substrates of the examples and comparative examples was observed with an EPMA (Electron Probe Micro Analyzer) system (manufactured by JEOL Ltd. under the product name of JXA-8500F), so as to determine whether or not a joint such as that illustrated in FIG. 5 was formed.

Then, on an EPMA image (at a magnification of 5000 times), three different positions were selected, the thickness of the layer 54 (second layer) containing $Ni_3P$ as a main component and the thickness of the layer 56 (third layer) containing an intermetallic compound as a main component were each determined as an average value of thicknesses at the three different positions selected. The interface between the layer 54 containing $Ni_3P$ as a main component and the layer 52 having a greater nickel/phosphorus atomic ratio than that of the layer 54 was determined by composition analysis. That is, a region where the nickel/phosphorus atomic ratio was 2.8 to 3.2 was defined as the layer 54, whereas a region where the atomic ratio exceeded 3.2 was defined as the layer 52.

Drop Test

Using a drop tester, a drop test for the evaluation mounting substrate was carried out. Specifically, at an impact acceleration of 14700 m/s$^2$, the evaluation mounting substrate was repeatedly dropped, and the resistance value between the terminal of the package substrate and the electrode terminal of the substrate was determined at each drop. The drop test was carried out by using six evaluation mounting substrates, and an average number of drops by which the resistance value became at least 1.2 times the initial resistance was determined. Table 2 lists the results.

TABLE 2

|  | Thickness of layer 54 μm | Thickness of layer 56 μm | Drop test number | Solder ball pull strength g |
|---|---|---|---|---|
| Example 1 | 0.50 | 2.5 | 133 | 31.0 |
| Example 2 | 0.57 | 2.0 | 51 | 32.0 |
| Example 3 | 0.48 | 2.4 | 130 | — |
| Example 4 | 0.44 | 2.1 | 87 | — |
| Comp. Ex. 1 | 0.33 | 2.2 | 1 | 30.0 |
| Comp. Ex. 2 | 0.23 | 2.3 | 2 | — |
| Comp. Ex. 3 | 0.27 | 0.3 | 1 | — |
| Comp. Ex. 4 | 0.17 | 2.0 | 11 | 31.0 |
| Comp. Ex. 5 | 0.23 | 1.8 | 11 | 30.0 |
| Comp. Ex. 6 | 0.30 | 0.9 | 6 | — |
| Comp. Ex. 7 | 0.30 | 0.3 | 30 | — |
| Comp. Ex. 8 | 0.33 | 3.1 | 9 | — |
| Comp. Ex. 9 | 0.13 | 0.0 | 2 | — |
| Comp. Ex. 10 | 0.30 | 1.8 | 9 | 33.5 |
| Comp. Ex. 11 | 0.23 | 2.2 | 2 | 33.5 |
| Comp. Ex. 12 | 0.30 | 2.3 | 6 | 31.0 |
| Comp. Ex. 13 | 0.33 | 0.0 | 2 | — |

In the table, "—" indicated unevaluated matters.

From the results listed in Table 2, the evaluation mounting substrates of Examples 1 to 4 in which the layer 54 containing Ni$_3$P as a main component had a thickness of 0.35 μm or greater were seen to have drop strengths superior to those of Comparative Examples 1 to 13. No significant difference was found between the solder ball pull strength of any of Examples 1 and 2 and that of each comparative example. Hence, it was seen that the structure required for improving the drop strength and the structure required for improving the ball pull strength were different from each other.

Figure 8:
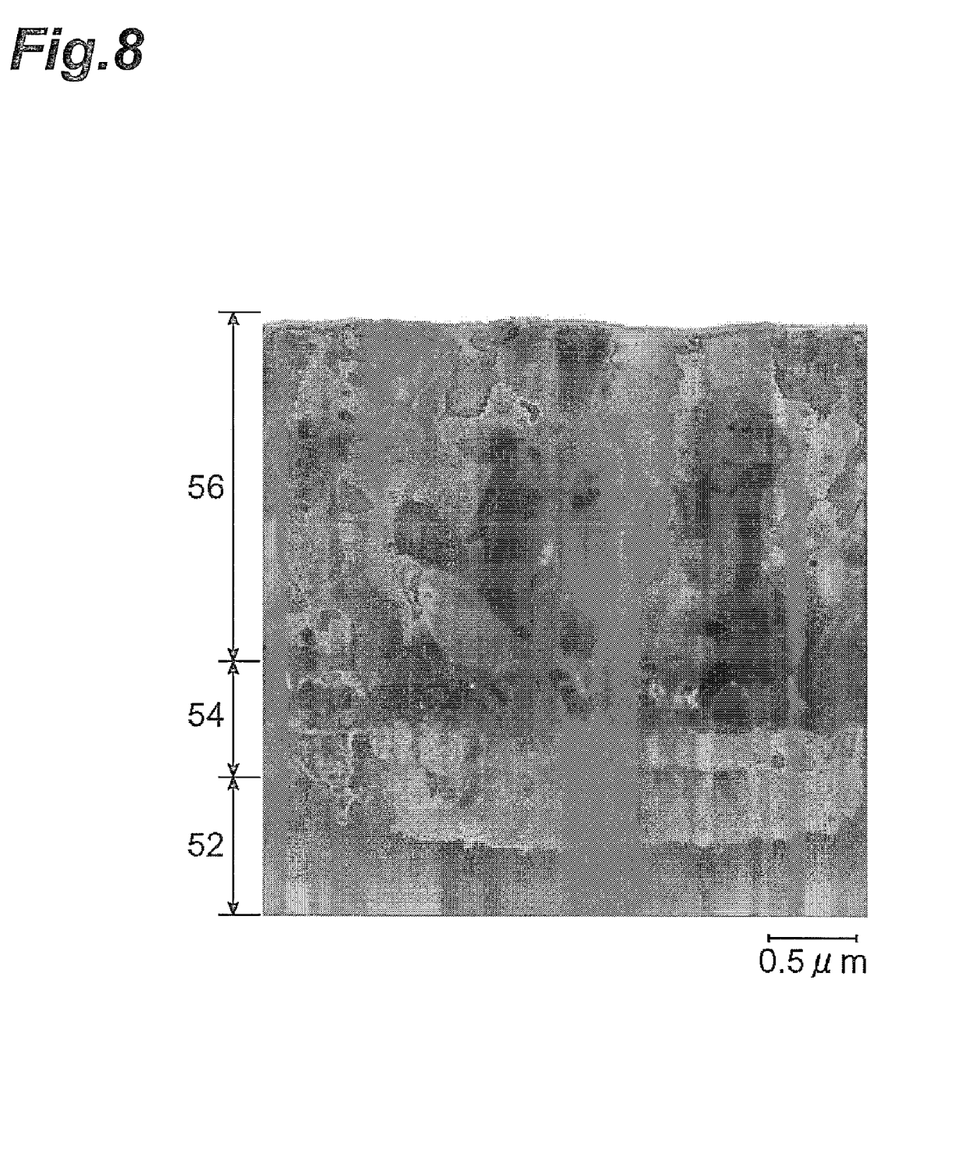
FIG. 8 is a SEM photograph of a cross section of the terminal structure in an evaluation mounting substrate of Example 1 before a drop test.
Figure 9:
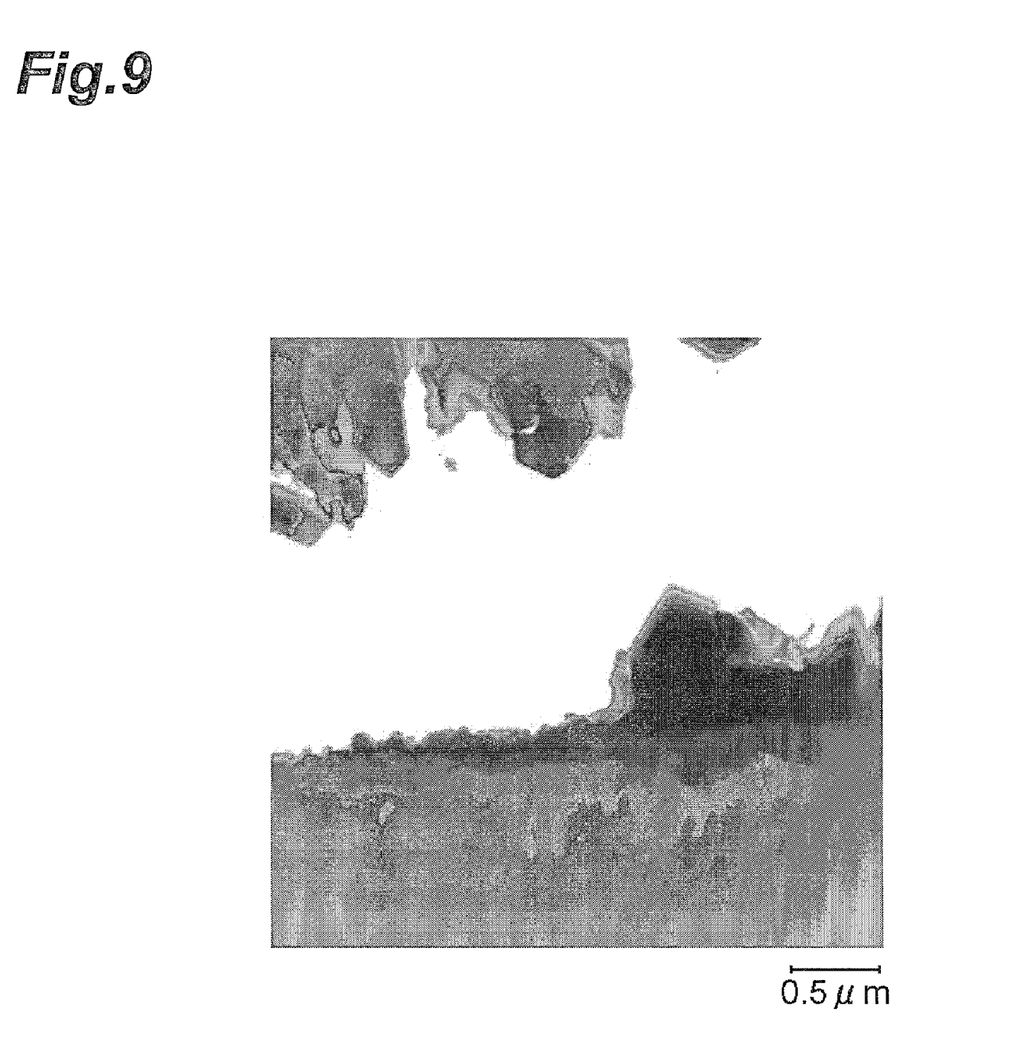
FIG. 9 is a SEM photograph of the cross section of the terminal structure in the evaluation mounting substrate of Example 1 after the drop test.

FIGS. 8 and 9 are SEM photographs of a cross section of the terminal structure in the evaluation mounting substrate of Example 1 before and after the drop test, respectively. FIG. 8 illustrates the cross section of the terminal structure before the drop test, whereas FIG. 9 illustrates the cross section of the broken terminal structure after the drop test.

Figure 10:
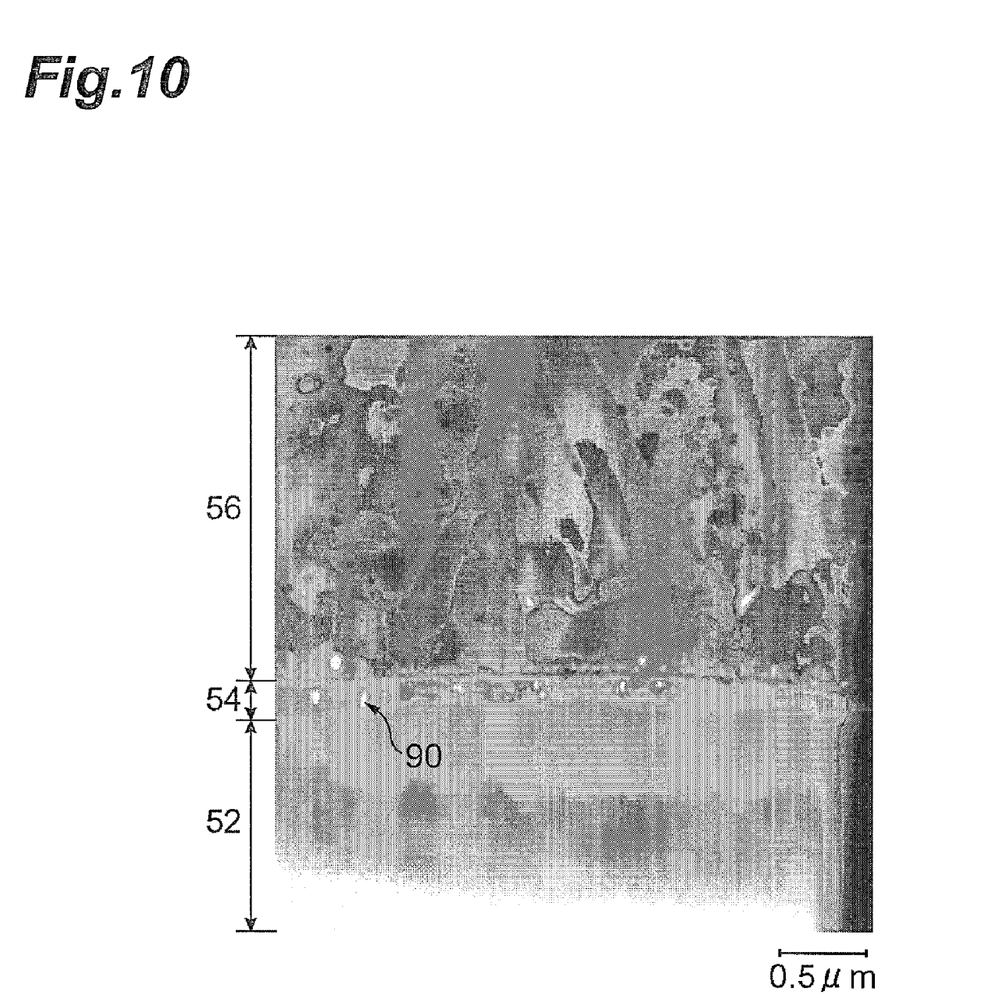
FIG. 10 is a SEM photograph of a cross section of the terminal structure in an evaluation mounting substrate of Comparative Example 1 before a drop test.
Figure 11:
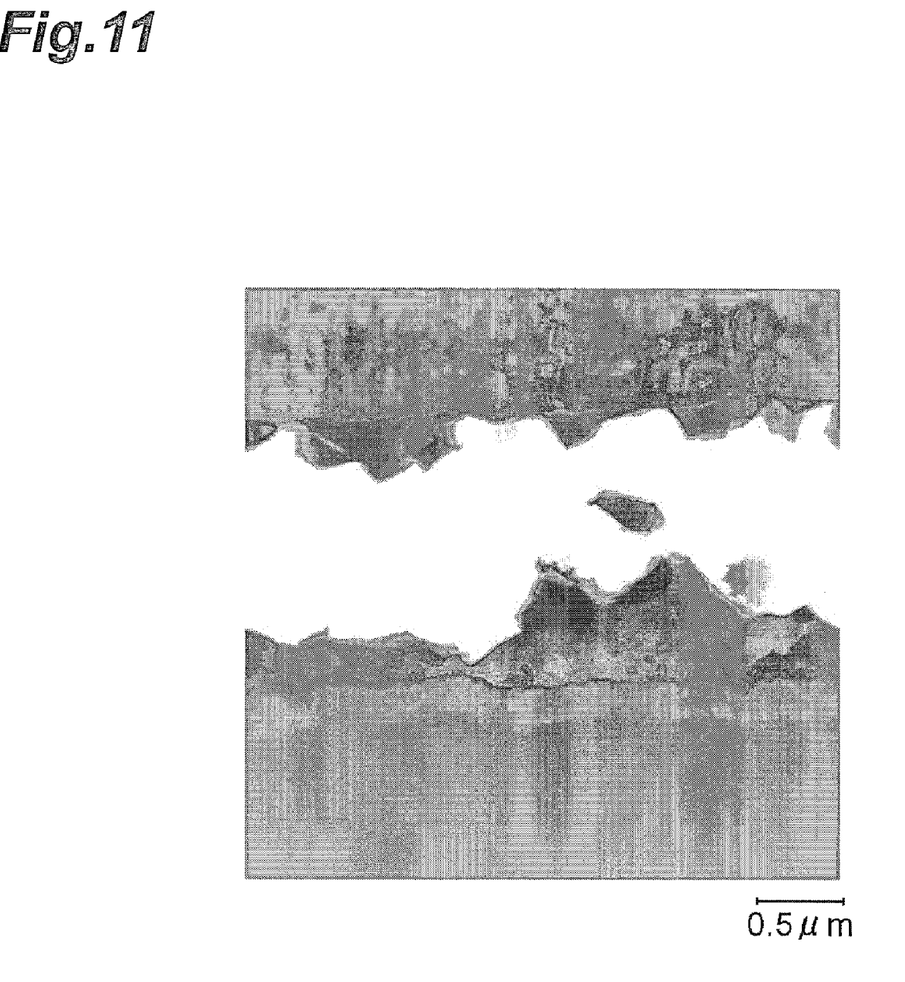
FIG. 11 is a SEM photograph of the cross section of the terminal structure in the evaluation mounting substrate of Comparative Example 1 after the drop test.

FIGS. 10 and 11 are SEM photographs of a cross section of the terminal structure in the evaluation mounting substrate of Comparative Example 1 before and after the drop test, respectively. FIG. 10 illustrates the cross section of the terminal structure before the drop test, whereas FIG. 11 illustrates the cross section of the broken terminal structure after the drop test.

When FIGS. 8 and 10 were compared with each other, no voids were seen in the layer 54 containing Ni$_3$P as a main component and the layer 56 containing an intermetallic compound as a main component in Example 1, whereas voids 90 were seen in the layers 54 and 56 in the terminal structure of Comparative Example 1. As obvious from the SEM photograph of FIG. 11, it was also seen that fractures occurred along the voids in the terminal structure of Comparative Example 1.

Composition in a Terminal Cross Section

Table 3 lists the results of element analysis by EPMA at positions of numbers 1 to 5 illustrated in FIG. 7.

TABLE 3

| Measured position Point | P at % | Ni at % | Cu at % | Ag at % | Su at % | Ni/P atomic ratio |
|---|---|---|---|---|---|---|
| 1 | 20.26 | 79.75 |  |  |  | 3.94 |
| 2 | 24.92 | 74.34 |  |  | 0.74 | 2.98 |
| 3 | 24.74 | 69.85 |  |  | 5.41 | 2.82 |
| 4 | 16.32 | 47.50 | 9.37 |  | 26.81 | 2.91 |
| 5 |  | 9.44 | 35.81 | 2.16 | 52.59 | — |

In the table, spaces indicate undetected matters and "P" indicates phosphorus.

As a result of the EPMA observation, the terminal between the substrates was seen to have a structure in which the first layer 52 containing nickel and phosphorus as main components, the second layer 54 containing Ni$_3$P as a main component, and the layer 56 containing an intermetallic compound [(Ni, Cu)$_6$Sn$_5$] were laminated on a copper pad in this order. From the nickel/phosphorus atomic ratio, points 2, 3, and 4 were seen to belong to the layer 54 containing Ni$_3$P as a main component. On the other hand, point 1 was seen to belong to the layer 52.

As mentioned above, the present invention can provide a terminal structure, a printed wiring board, and a module substrate which can achieve sufficiently excellent drop strength. It can also provide an electronic device which, by mounting such a printed wiring board and module substrate, does not easily break electric connections even when a shock of falling or the like is applied thereto.

What is claimed is:

1. A terminal structure comprising:
   a terminal having a conductor containing at least one metal selected from the group consisting of gold, silver, and copper,
   a first layer containing phosphorus and nickel disposed on the conductor,
   a second layer having a nickel/phosphorus atomic ratio smaller than that of the first layer and containing Ni$_3$P disposed on the first layer, and
   a third layer containing (Cu,Ni)$_6$Sn$_5$ directly contacting the second layer; and
   a solder disposed on the third layer of the terminal;
   wherein the second layer has a thickness of at least 0.35 μm.

2. The terminal structure according to claim 1, wherein the second layer has a part where the Ni$_3$P content becomes higher as the solder is nearer.

3. The terminal structure according to claim 2, wherein the second layer has a lead content of 100 ppm or less.

4. The terminal structure according to claim 1, wherein the second layer has a lead content of 100 ppm or less.

5. A printed wiring board having the terminal structure according to claim 1.

6. An electronic device mounted with the printed wiring board according to claim 5.

7. A module substrate comprising the terminal structure according to claim 1 and an electronic instrument electrically connected to the conductor in the terminal structure.

8. An electronic device mounted with the module substrate according to claim 7.

* * * * *